United States Patent [19]

Sawada et al.

[11] Patent Number: 5,430,325
[45] Date of Patent: Jul. 4, 1995

[54] SEMICONDUCTOR CHIP HAVING DUMMY PATTERN

[75] Inventors: Hideki Sawada; Hiromi Ogata, both of Kyoto, Japan

[73] Assignee: Rohm Co. Ltd., Japan

[21] Appl. No.: 81,392

[22] Filed: Jun. 22, 1993

[30] Foreign Application Priority Data

Jun. 30, 1992 [JP] Japan ................. 4-171416

[51] Int. Cl.⁶ .......................................... H01L 21/78
[52] U.S. Cl. ................... 257/618; 257/620; 257/797; 437/226; 437/227
[58] Field of Search ............... 257/797, 620, 618; 437/226, 227

[56] References Cited

U.S. PATENT DOCUMENTS

| | | | |
|---|---|---|---|
| 4,364,078 | 12/1982 | Smith et al. | 257/620 |
| 4,396,934 | 8/1983 | Nishida et al. | 257/620 |
| 4,841,354 | 6/1989 | Inaba | 257/620 |

FOREIGN PATENT DOCUMENTS 2065153  3/1990  Japan .

*Primary Examiner*—William Mintel
*Assistant Examiner*—Roy Potter
*Attorney, Agent, or Firm*—Samuels, Gauthier & Stevens

[57] ABSTRACT

A plurality of semiconductor chips are formed on a wafer. By forming a dummy pattern of a linear shape on an insulating film formed on a semiconductor chip along dicing lines provided for separating the plurality of semiconductor chips into the individual semiconductor chips, when the separation of the semiconductor chips is performed along the dicing lines, an advancing of a film peeling to a recognition mark for bonding within the dummy pattern or elements is prevented to reduce both a recognition error of information at the time of bonding of the semiconductor chip and the number of defective elements.

18 Claims, 5 Drawing Sheets

SEMICONDUCTOR CHIP HAVING DUMMY PATTERN

BACKGROUND OF THE INVENTION i) Field of the Invention

The present invention relates to a semiconductor chip with which die bonding or wire bonding is carried out by an automaton, and more particularly to a semiconductor chip having a dummy pattern for preventing peeling of an insulating film formed on the semiconductor chip having a recognition area including a recognition mark having bonding information.

ii) Description of the Related Arts

Conventionally, for example, in an LED head to be mounted on a facsimile machine, a printer or the like, during its production process, wire bonding between an LED chip and an IC is carried out by an automaton. At this time, the automaton is adapted to perform the wire bonding on the basis of a recognition mark provided on the LED chip and information of a recognition area.

This will be described in detail in connection with FIG. 1 to FIG. 3. Generally, a plurality of semiconductor chips 10 such as LED chips or the like with which die bonding or wire bonding are carried out is formed on a wafer and in order to separate the semiconductor chips 10, dicing lines 3 are drawn at their peripheries. The wafer is cut along the dicing lines 3 by a dicing saw rotating at a high speed so as to separate into a plurality of semiconductor chips. In a further process, die bonding of the separated semiconductor chip 10 on a substrate or wire bonding of the semiconductor chip 10 with an IC or the like is carried out by an automaton. At the die bonding or the wire bonding stage, a recognition mark 1 and its surrounding recognition area 2 are used. By binary-coding of a pattern represented by the recognition mark 1 and the recognition area 2, the automaton recognizes the information represented by the pattern and executes the die bonding or the wire bonding in a predetermined position in a predetermined order.

As shown in FIG. 2, when an impurity diffusion layer 4 to become a light emitting part is formed by doping an impurity such as zinc or the like, the recognition mark 1 of the semiconductor chip 10 is formed by the same impurity at the same time. At this time, the recognition mark 1 and the impurity diffusion layer 4 are formed by doping the impurity through diffusion windows 5a opened in parts of an insulating film 5. Further, alternatively, as shown in FIG. 3, when a wiring pattern such as an electrode 6 is formed, the recognition mark 1 is simultaneously formed on the insulating film 5 by an aluminum vapor deposition means or the like.

As will be apparent from FIG. 1, usually, the recognition mark 1 is set near the dicing lines 3 in one corner of the semiconductor chip 10, and as a matter of course, the recognition area 2 including the recognition mark 1 is also positioned near the dicing lines 3. However, the insulating film 5 formed on the surface of the semiconductor chip 10 can be peeled off from an end edge 7 cut at the time of dicing. When the film peeling does not reach the recognition area 2, there is no problem with reading the bonding information. However, as shown in FIGS. 1 and 2, when the film peeling 8 (a hatching area in FIG. 1) reaches the recognition area 2, a recognition error often occurs at the time when the binary-coded information is read by the automaton. In particular, When the film peeling 8 reaches the recognition mark 1, the probability of the recognition error occurring rises sharply. This is considered to be caused because by the film peeling 8, the surface condition of the recognition mark 1 and the recognition area 2 becomes different from normal and the binary-coded information of the recognition mark 1 and the recognition area 2 is changed to cause the recognition error of the automaton.

Further, when the insulating film 5 of the surface is peeled off at the position other than near the recognition mark 1 and the recognition area 2, a defective element of the semiconductor chip 10 having no normal function results, for example, the light emission is caused at the position other than the desired light emitting part or the electrode is short-circuited.

SUMMARY OF THE INVENTION

It is therefore an object of the present invention to provide a semiconductor chip in view of the aforementioned problems of the prior art, which is capable of reducing a recognition error of bonding information and a defective element due to film peeling caused at the time of dicing.

In order to achieve the object of the present invention, firstly, in a semiconductor chip according to the present invention, a dummy pattern for preventing advancing of the peeling of an insulating film caused at the time of dicing to a recognition area is provided between the recognition area, including a recognition mark, set near a dicing line and the dicing line itself. Also, secondly, another dummy pattern for preventing a formation of the peeling of the insulating film caused at the time of dicing is provided between each element and the dicing line. Further, thirdly, by the forms of the recognition mark and the dummy pattern and their positional relationship, a recognition pattern of bonding information is formed.

In the semiconductor chip of the present invention, since the dummy pattern possesses a function for preventing the peeling of the insulating film, even when the peeling of the insulating film is caused from a chip end edge at the time of dicing, the film peeling is stopped at the dummy pattern and thus no film peeling reaches the recognition area including the recognition mark determined within the dummy pattern to reduce both recognition error caused by the film peeling and defective elements. Further, by the form of the recognition mark, the form of the dummy pattern and their positional relationship, the recognition pattern is formed, and by giving the bonding information required such as the boding position, the bonding order and the like to the recognition pattern, the recognition of the bonding information by the automaton can be readily and exactly carried out.

Since the semiconductor chip having a dummy pattern of the present invention is constructed as described above, in a producing process of the semiconductor chip, a reduction of defect rate and an improvement of machine operability of an automaton for production is possible and the production cost of the semiconductor chip can be reduced.

According to the present invention, as long as the dummy pattern can prevent the film peeling due to the dicing, the dummy pattern is not restricted in its material and shape, and concerning the material, aluminum is optimum from a viewpoint of ease of the pattern formation and the like. Also, the pattern form is not limited in its width and length so long as the dummy pattern can prevent the advancing of the film peeling to the recognition area or the elements.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

Figure 1:
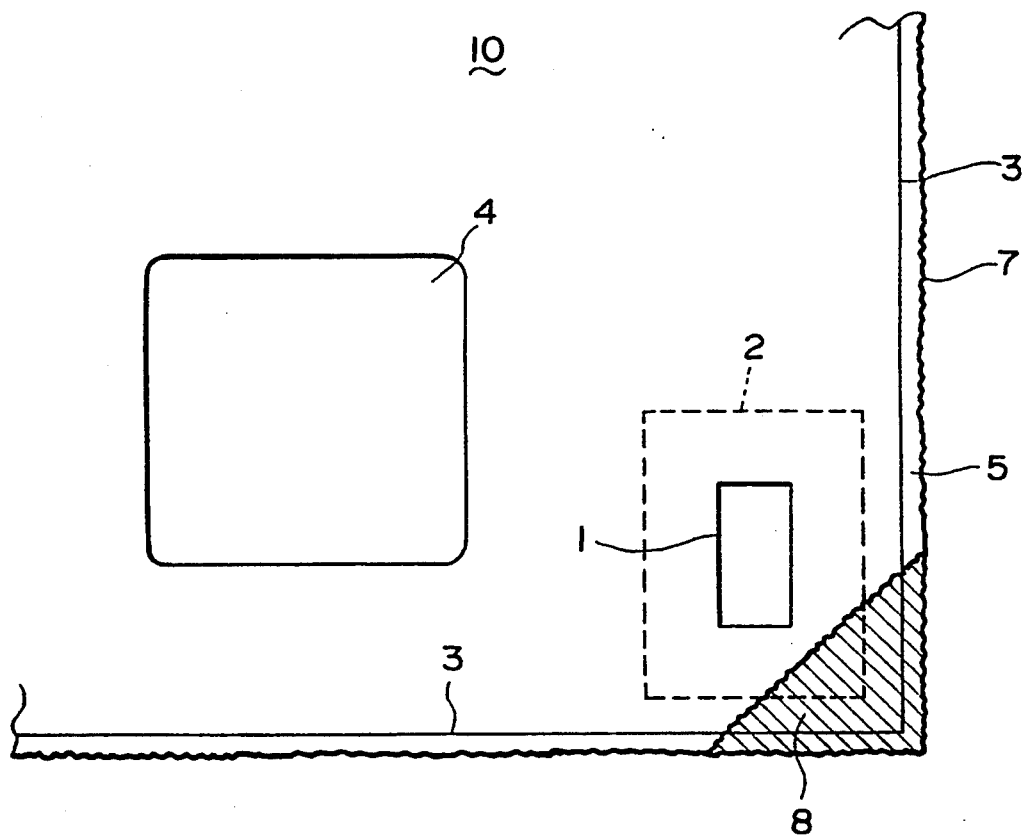
FIG. 1 is a fragmentary top view of a conventional semiconductor chip having a recognition mark.
Figure 2:
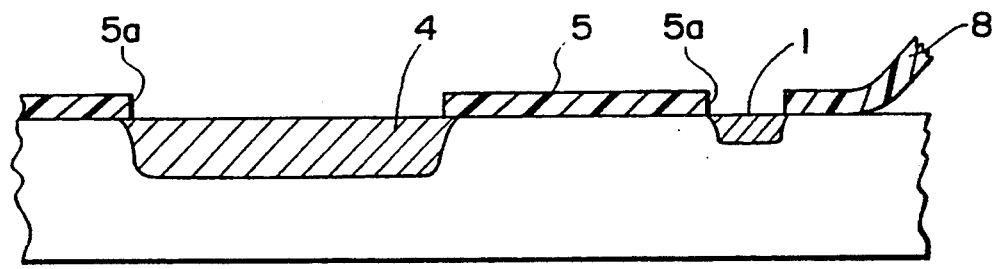
FIG. 2 is a fragmentary cross section of a conventional semiconductor chip having a recognition mark.
Figure 3:
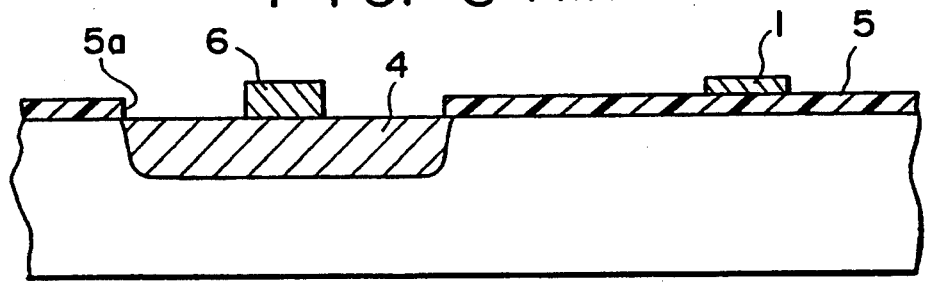
FIG. 3 is a fragmentary cross section of another conventional semiconductor chip having a recognition mark.
Figure 4:
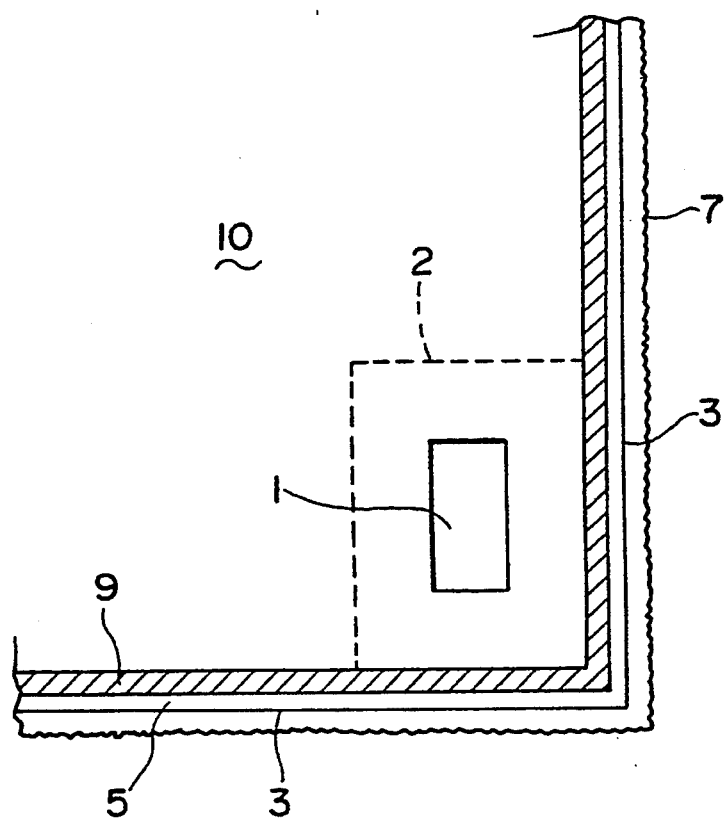
FIG. 4 is a fragmentary top view of a semiconductor chip having a dummy pattern according to the present invention.

The present invention will now be described in connection with its preferred embodiments with reference to the accompanying drawings, wherein the same parts as those described above in connection with the conventional embodiments are designated by the same reference characters and thus the repeated description thereof can be omitted for brevity. In FIG. 4, there is shown one embodiment of a semiconductor chip according to the present invention.

As shown in FIG. 4, the semiconductor chip 10 is separated along predetermined dicing lines 3 by dicing and by cutting, and an end edge 7 is formed at the periphery of the semiconductor chip 10. In one corner of the semiconductor chip 10, a recognition mark 1 and a rectangular recognition area 2 including the recognition mark 1 are determined near the dicing lines 3.

A dummy pattern 9 as the distinctive feature of the present invention is formed on an insulating film 5 by a vapor deposition of aluminum and is extended in a linear form having a fixed width between the recognition area 2 and the dicing lines 3 and runs parallel to the dicing lines 3. This dummy pattern 9 is formed at the same time as a wiring pattern such as an electrode and the like are formed on the semiconductor chip 10. The two sides of the rectangular recognition area 2 are defined by the edge of the dummy pattern 9 and the edge of the dummy pattern 9 constitutes a border line between the recognition area 2 and the dummy pattern 9. In this embodiment, although the dummy pattern 9 is provided along the dicing lines 3 at the periphery of the semiconductor chip 10, it is not always necessary to provide the dummy pattern 9 at the periphery of the semiconductor chip 10, and it is sufficient to form the dummy pattern 9 so as to prevent the peeling of the insulating film 5 formed on the semiconductor chip 10 from reaching the recognition area 2.

In such a semiconductor chip 10, even when the insulating film 5 is peeled off from the end edge 7 at the time of dicing, the insulating film 5 is held down by the dummy pattern 9 and the advancing of the peeling of the insulating film 5 is stopped by the dummy pattern 9. As a result, no peeling of the insulating film 5 is caused either in the recognition mark 1 or the recognition area 2 positioned within the dummy pattern 9. Hence, no binary-coded information of the recognition mark 1 and the recognition area 2 is changed, and the probability of recognition error of the bonding information is extremely low when the die bonding or the wire bonding is carried out by the automaton.

Figure 5:
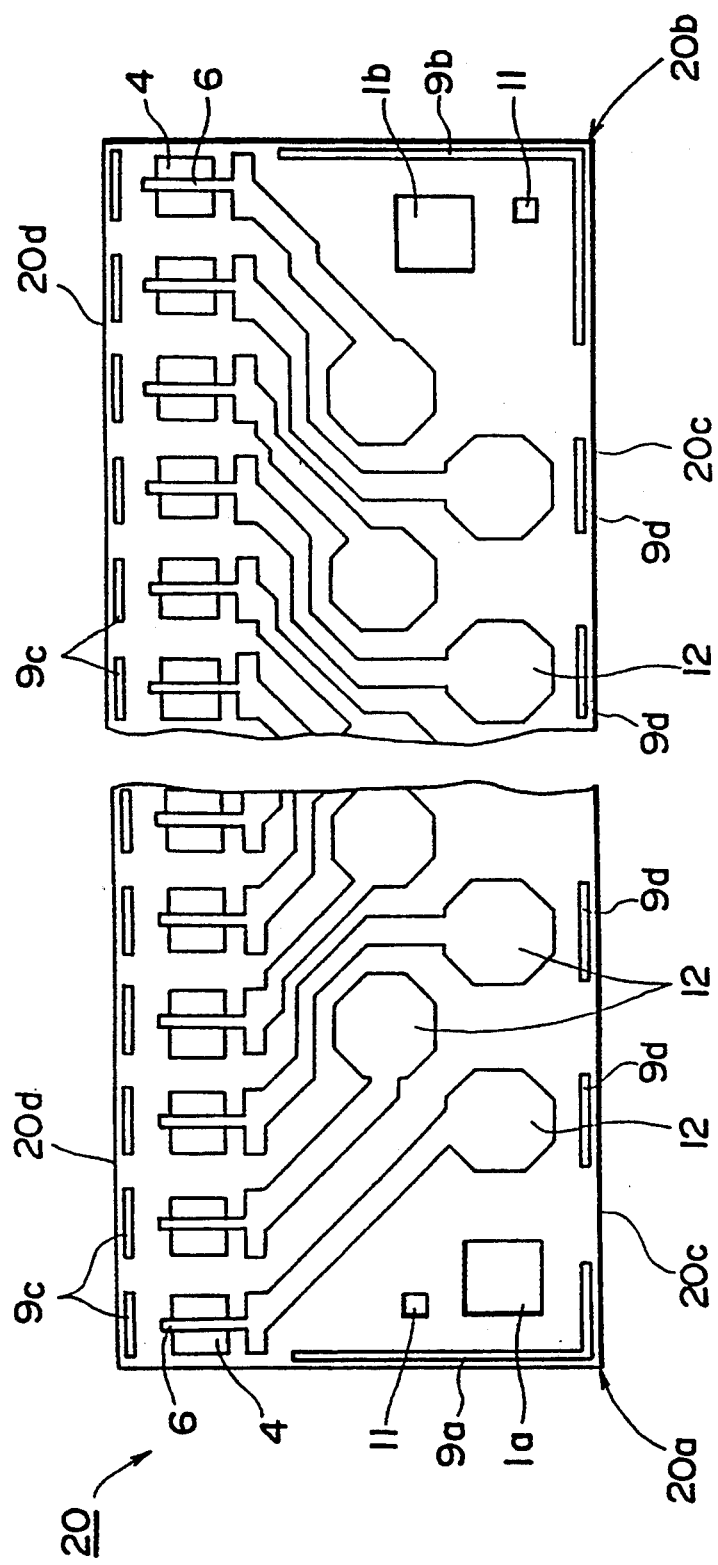
FIG. 5 is a fragmentary top view of an LED chip having a dummy pattern according to,the present invention.

FIG. 5 illustrates another embodiment of a semiconductor chip according to the present invention, that is, an LED chip 20. In FIG. 5, at the wire bonding stage, mask alignment marks 11 are used for positioning the LED chip 20 and an automaton (not shown), and a plurality of pads 12 for the wire bonding of a plurality of LEDs are used. In one corner 20a of the LED chip 20, an L-shaped dummy pattern 9a is formed along the dicing lines 3 and possesses the same function as the dummy pattern 9 shown in FIG. 4. In the internal side of the L-shaped dummy pattern 9a, a recognition mark 1a is formed. In another corner 20b positioned on the same end side 20c of the LED chip 20, similarly, another L-shaped dummy pattern 9b and another recognition mark 1b are formed in the same manner as the L-shaped dummy pattern 9a and the recognition mark 1a.

In this case, the length ratio between the two sides of the L-shaped dummy pattern 9a formed in the corner 20a and the ratio between the distances from the recognition mark 1a to the two sides of the L-shaped dummy pattern 9a are different from those of the L-shaped dummy pattern 9b and the recognition mark 1b formed in the other corner 20b. A combination of the L-shaped dummy pattern 9a or 9b and the recognition mark 1a or 1b constitute a recognition pattern which gives the bonding information required when the bonding is executed. By this recognition pattern, the automaton can exactly recognize to which pad of the LED chip 20 and from which end thereof the operation is started when the wire bonding is continuously performed, and thus the wire bonding to the pads can be exactly executed.

Further, a plurality of dummy patterns 9c are formed between impurity diffusion layers 4 which will become light emitting parts and another end side 20d opposite to the end side 20c, and a plurality of dummy patterns 9d are also formed between the pads 12 near the end side 20c and the end side 20c. The dummy patterns 9c and 9d hold down the insulating film to prevent the peeling of the insulating film from developing to the light emitting parts and the pads in the same manner as the L-shaped dummy patterns 9a and 9b. The dummy patterns 9c are formed so as to be separated from each of the elements (the light emitting parts) in order to prevent a current flow to an unexpected position due to a contact between one of the dummy patterns 9c and one of the electrodes 6. That is, when the impurity is doped by using diffusion windows to form light emitting parts, the impurity can often be doped into an undesired place, for example, under the dummy patterns 9c. In such a situation, if the dummy patterns 9c are formed in a shape of one continuous line, by contacting a part of the continuous dummy pattern 9c with one electrode 6 owing to the peeling of the insulating film, when the current is applied to this electrode, the current is also applied to the continuous dummy pattern 9c to cause the light emission along the continuous dummy pattern 9c and the LED chip 20 can not be exactly operated. For preventing this defective operation, the dummy patterns 9c are separately formed for every element (every light emitting part). Also, the dummy patterns 9d are separately formed with respect to the pads 12 in order to prevent conduction among the pads 12 when one pad 12 is contacted with a continuous dummy pattern by the peeling of the insulating film.

Figure 6A:
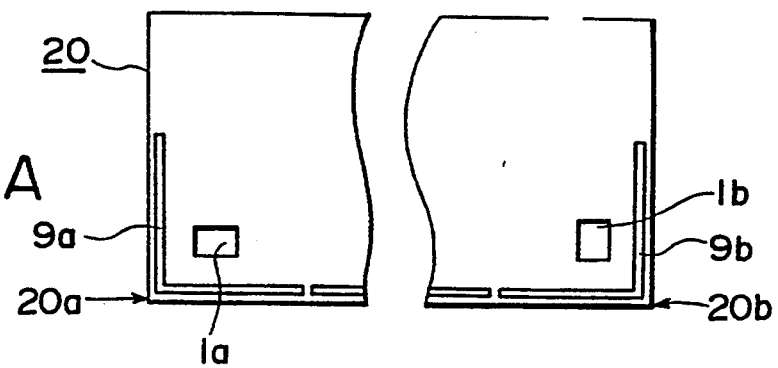
FIGS. 6A, 6B and 6C are schematic top views, partly broken, of LED chips having dummy patterns and recognition marks according to the present invention for explaining a relationship between the dummy pattern and the recognition mark.
Figure 6B:
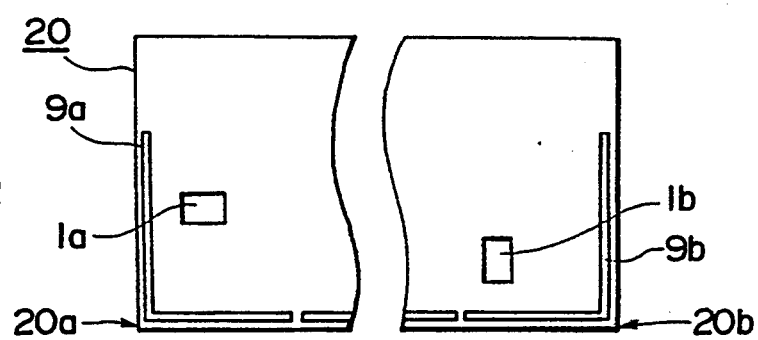
Figure 6C:
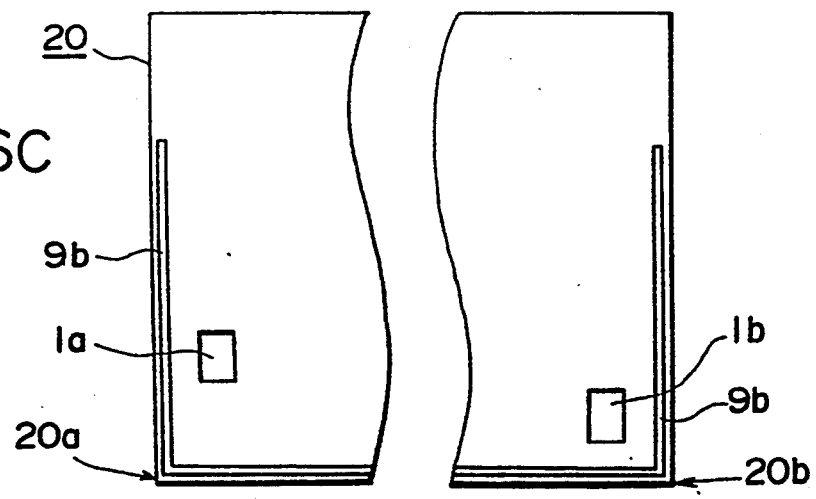

FIGS. 6A, 6B and 6C show different embodiments of the patterns of the combination of the L-shaped dummy patterns 9a and 9b and the recognition marks 1a and 1b of the LED chip 20 shown in FIG. 5. In FIG. 6A, the length ratio between the two sides of the L-shaped dummy patterns 9a and 9b are same and the distance between the L-shaped dummy pattern 9a and the recognition mark 1a is the same as the distance between the L-shaped dummy pattern 9b and the recognition mark 1b. Also, the shape of the recognition marks 1a an 1b are the same rectangle, but their postures are different, such as a horizontal type and a vertical type.

In FIG. 6B, although the length ratios between the two sides of the L-shaped dummy patterns 9a and 9b are same, the postures of the recognition marks 1a and 1b are different from each other and the distance between the L-shaped dummy pattern 9a and the recognition mark 1a is different from the distance between the L-shaped dummy pattern 9b and the recognition mark 1b. Further, in FIG. 6C, the postures of the recognition marks 1a and 1b are the same, but the distance between the L-shaped dummy pattern 9a and the recognition mark 1a is different from the distance between the L-shaped dummy pattern 9b and the recognition mark 1b. In any case, when the wire bonding or the like is executed by the automaton, the automaton can readily and exactly read the differences, that is, from which end of the LED chip 20 and in which order the operation is performed, and thus the directing property of the LED chip 20 can be discriminated.

Figure 7:
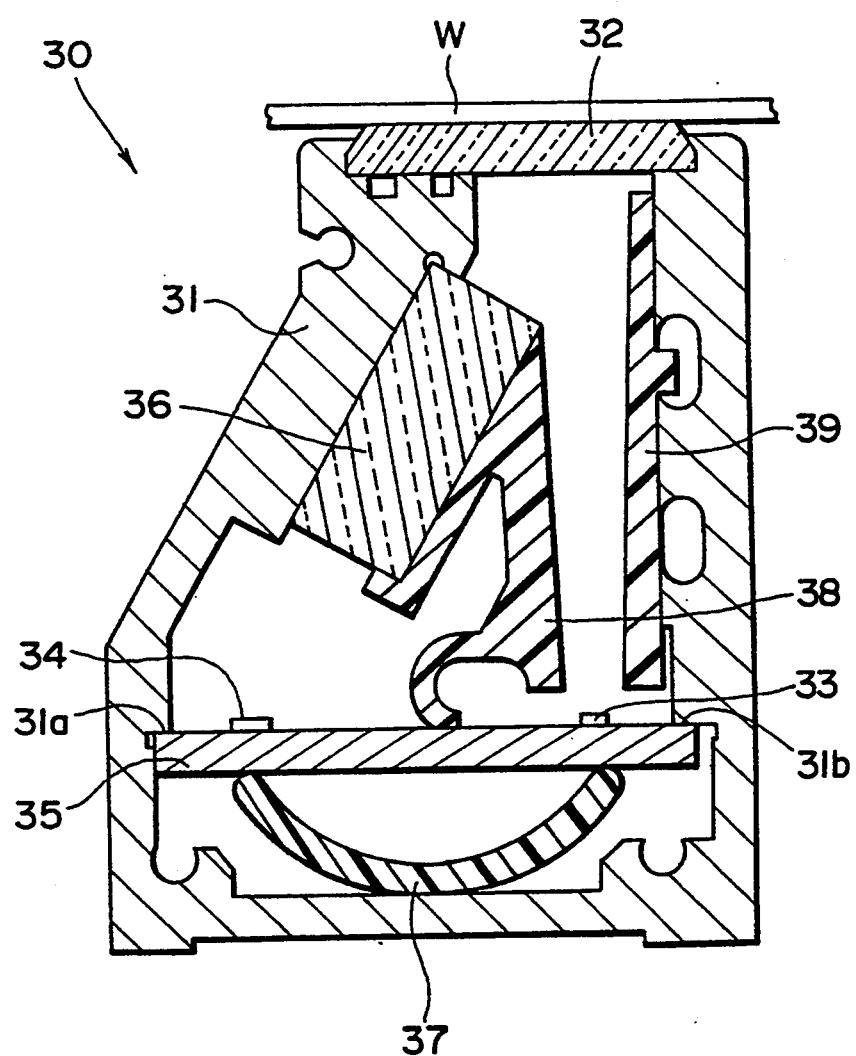
FIG. 7 is a longitudinal cross section of an image sensor including an LED chip having a dummy pattern according to the present invention.

FIG. 7 shows an image sensor which a semiconductor chip having a dummy pattern according to the present invention is mounted on. In the image sensor 30, a transparent cover (glass cover) 32 is mounted on the top of a frame 31. In the frame 31, a substrate 35 having a light emitting element (an LED chip or the like) 33 as a light emitting part and a photo detecting element (a photo diode chip or the like) 34 as a photo detecting part, and a rod lens array 36 as an optical system for condensing the light reflected from a document W put on the transparent cover 32 are arranged.

The substrate 35 is pushed upwards from the bottom by a U-shaped bent spring 37 as a resilient member mounted in the lower part of the frame 31 and the upper surface of the substrate 35 is pushed onto projection walls 31a and 31b formed on the internal wall of the frame 31 to hold the substrate 35. Hence, since the upper surface of the substrate 35 having the photo detecting element 34 thereon becomes standard at the mounting stage, the focusing of the photo detecting element 34 with respect to the rod lens array 36 can be improved regardless of the accuracy of the frame 31.

The rod lens array 36 is mounted in a slant position so that its optical axis may have a slant angle with respect to the surface of the transparent cover 32 and is pushed and held onto the internal wall of the frame 31 by a lens holder 38. The light emitted from the light emitting element 33 passes through a light path formed by the lens holder 38 and a side wall 39 and is vertically incident on the document W mounted on the transparent cover 32. The light reflected from tile document W is converged by the rod lens array 36 and the converged light is detected by the photo detecting element 34 to convert the light into an electric signal.

Therefore, by mounting a semiconductor chip having a dummy pattern according to the present invention on an electronic device such as an image sensor or the like, the electronic device having excellent productivity and a lower defective rate can be provided at a low cost.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor chip having a dummy pattern, said semiconductor chip being produced by a production method comprising the steps of:
   preparing a wafer including a plurality of semiconductor chips having an insulating film on a surface, each semiconductor chip including a recognition pattern containing processing information;
   forming dicing lines on the wafer for separating the semiconductor chips formed on the wafer into individual semiconductor chips;
   forming dummy patterns having a linear shape for each of said semiconductor chips on the surface of said insulating film along and offset from the dicing lines, and positioned between said dicing lines and said recognition patterns; and
   separating the semiconductor chips by cutting the wafer along the dicing lines, wherein
   each of said dummy patterns prevents peeling of said insulating film, thus preserving the processing information contained by said recognition patterns.

2. The semiconductor chip having a dummy pattern of claim 1, wherein each of the dummy patterns is formed by aluminum.

3. The semiconductor chip having a dummy pattern of claim 1, wherein the recognition patterns of each semiconductor chip includes a recognition area including a recognition mark having bonding information for carrying out a bonding process against an electrode pad of a wiring pattern, and the dummy pattern is formed on the insulating film between the recognition area and the dicing line.

4. The semiconductor chip having a dummy pattern of claim 3, wherein the dummy pattern is formed by aluminum.

5. The semiconductor chip having a dummy pattern of claim 1, wherein the recognition patterns of each semiconductor chip includes a recognition mark having bonding information for carrying out a bonding processing against an electrode pad of a wiring pattern, and the dummy pattern is formed on the insulating film between the recognition mark and the dicing line.

6. The semiconductor chip having a dummy pattern of claim 5, wherein the dummy pattern is formed by aluminum.

7. The semiconductor chip having a dummy pattern of claim 5, wherein said bonding information contained in said recognition pattern is defined by a form of the recognition mark, a form of the dummy pattern and their positional relationship.

8. The semiconductor chip having a dummy pattern of claim 7, wherein the dummy pattern is formed by aluminum.

9. The semiconductor chip having a dummy pattern of claim 1, wherein on the insulating film between elements associated with each semiconductor chip and the dicing line formed on the semiconductor chip, dummy patterns separated from each other are provided for every element.

10. The semiconductor chip having a dummy pattern of claim 9, wherein the dummy patterns are formed by aluminum.

11. The semiconductor chip having a dummy pattern of claim 9, wherein the recognition pattern of each semiconductor chip includes a recognition area including a recognition mark having bonding information for carrying out a bonding process against an electrode pad of a wiring pattern, and the dummy pattern is formed on the insulating film between the recognition area and the dicing line.

12. The semiconductor chip having a dummy pattern of claim 11, wherein the dummy pattern is formed by aluminum.

13. The semiconductor chip having a dummy pattern of claim 9, wherein the recognition pattern of each semiconductor chip includes a recognition mark having bonding information for carrying out a bonding process against an electrode pad of a wiring pattern, and the dummy pattern is formed on the insulating film between the recognition mark and the dicing line.

14. The semiconductor chip having a dummy pattern of claim 13, wherein the dummy pattern is formed by aluminum.

15. The semiconductor chip having a dummy pattern of claim 13, wherein said bonding information contained in said recognition pattern is defined by a form of the recognition mark, a form of the dummy pattern and their positional relationship.

16. The semiconductor chip having a dummy pattern of claim 15, wherein the dummy pattern is formed by aluminum.

17. A method of producing a semiconductor chip having a dummy pattern, comprising the steps of:
  preparing a wafer including a plurality of semiconductor chips having an insulating film on a surface, each semiconductor chip including a recognition pattern containing processing information;
  forming dicing lines on the wafer for separating the semiconductor chips formed on the wafer into individual semiconductor chips;
  forming dummy patterns for each of said semiconductor chips on the surface of said insulating film along and offset from the dicing lines, and positioned between said dicing lines and said recognition patterns; and
  separating the semiconductor chips by cutting the wafer along the dicing lines, wherein
  each of said dummy patterns prevents peeling of said insulating film, thus preserving the processing information contained by said recognition patterns.

18. A plurality of semiconductor chips configured on a substrate having an insulating film on a surface thereof, each of said semiconductor chips comprising:
  a recognition pattern containing processing information;
  dicing lines on the substrate for separating the semiconductor chips formed on the substrate into individual semiconductor chips; and
  dummy patterns formed on the surface of said insulating film along and offset from the dicing lines, and positioned between said dicing lines and said recognition patterns, wherein each of said dummy patterns prevents peeling of said insulating film, thus preserving the processing information contained by said recognition patterns.

* * * * *